(12) United States Patent
Egerer

(10) Patent No.: US 7,471,584 B2
(45) Date of Patent: Dec. 30, 2008

(54) INTEGRATED SEMICONDUCTOR MEMORY AND METHOD FOR OPERATING AN INTEGRATED SEMICONDUCTOR MEMORY

(75) Inventor: Jens Christoph Egerer, Kirchheim (DE)

(73) Assignee: Qimonda AG, Munich (DE)

( * ) Notice: Subject to any disclaimer, the term of this patent is extended or adjusted under 35 U.S.C. 154(b) by 51 days.

(21) Appl. No.: 11/746,173

(22) Filed: May 9, 2007

(65) Prior Publication Data

US 2007/0274147 A1 Nov. 29, 2007

(30) Foreign Application Priority Data

May 9, 2006 (DE) .......................... 10 2006 021 527

(51) Int. Cl.
*G11C 7/00* (2006.01)
*G11C 8/00* (2006.01)
*G11C 7/04* (2006.01)

(52) U.S. Cl. ................. 365/212; 365/211; 365/222; 365/233.1

(58) Field of Classification Search .......... 374/100–207
See application file for complete search history.

(56) References Cited

U.S. PATENT DOCUMENTS

| | | |
|---|---|---|
| 6,438,057 B1 | 8/2002 | Ruckerbauer |
| 6,966,693 B2 * | 11/2005 | Prakash et al. ............. 374/163 |
| 2006/0002217 A1 | 1/2006 | Walker et al. |
| 2006/0262474 A1 * | 11/2006 | Chen et al. .................. 361/103 |
| 2007/0001694 A1 * | 1/2007 | Jahagirdar et al. .......... 324/760 |

FOREIGN PATENT DOCUMENTS

| DE | 101 63 306 A1 | 4/2003 |
|---|---|---|
| WO | WO 2006/014315 A1 | 2/2006 |

* cited by examiner

*Primary Examiner*—Hoai V Ho
*Assistant Examiner*—Michael J Weinberg
(74) *Attorney, Agent, or Firm*—Slater & Matsil, L.L.P.

(57) ABSTRACT

An integrated semiconductor memory that has at least one temperature measuring element and repeatedly carries out a temperature measurement during the operation of the semiconductor memory, wherein the semiconductor memory repeats the temperature measurement at instants corresponding to a measuring frequency of the temperature measuring element. According to an embodiment of the invention, the measuring frequency of the temperature measuring element is variable and the temperature measuring element is driven in such a way that the measuring frequency changes in a manner dependent on the temporal development of measured values of the repeated temperature measurements.

47 Claims, 5 Drawing Sheets

INTEGRATED SEMICONDUCTOR MEMORY AND METHOD FOR OPERATING AN INTEGRATED SEMICONDUCTOR MEMORY

This application claims priority to German Patent Application 10 2006 021 527.3, which was filed May 9, 2006 and is incorporated herein by reference.

The invention relates to an integrated semiconductor memory and a method for operating an integrated semiconductor memory. In the case of integrated semiconductor memories, a distinction is made between volatile semiconductor memories and nonvolatile semiconductor memories. Volatile semiconductor memories have memory cells whose memory content has to be refreshed at regular time intervals if the stored information is not to be lost. Volatile semiconductor memories are DRAMs (Dynamic Random Access Memory), for example, whose memory cells in each case have a selection transistor and a storage capacitor, for instance, a trench capacitor. The information to be stored is stored in the form of electrical charges in the storage capacitor. Part of the charge is gradually lost on account of leakage currents. Therefore, volatile memory cells are refreshed at periodic time intervals in the range of milliseconds or a few hundred microseconds. During refresh, the stored charge is read out, amplified and subsequently written back to the memory cell again. The stored charge is thus renewed during each refresh operation.

The speed at which a volatile semiconductor memory loses the stored electrical charges is temperature-dependent. The loss of charge caused by leakage currents per unit time rises exponentially with the temperature. Therefore, the refresh rate, i.e., the clock rate, at which a renewed refresh operation is in each case carried out should be adapted to the operating temperature of a semiconductor memory. Temperature measuring elements are used for this purpose, the elements being arranged on the semiconductor memories and usually being integrated into the latter. Thus, the temperature of the semiconductor memory is measured and a suitable refresh rate for the memory cells is selected in a manner dependent on the measured temperature. Ideally, each semiconductor memory always checks its own temperature and, in the case of temperature fluctuations, if necessary, selects a different frequency for the refresh of the memory cells. Thus, in the case where a semiconductor chip is heated on account of intensified accesses as a result of write or read commands that drive the memory cells, it is possible to increase the refresh rate for the memory cells, i.e., to shorten the time interval between successive refresh operations.

By contrast, the clock rate at which the temperature measurement itself is carried out is conventionally always effected at a fixed frequency that remains constant. Maximally at each instant at which a temperature measurement is repeated, the refresh rate is variable or an arbitrary other parameter or control operation for operating the semiconductor memory is variable. The utilization of the temperature measurement on the semiconductor chip need not necessarily relate or be restricted to the refresh rate of the memory cells. In all cases, however, a corresponding control operation or an adaptation of a parameter such as the refresh rate, for instance, can be performed only given the presence of a temperature value that has been measured anew and, under certain circumstances, has altered.

What is disadvantageous, however, about the regularly repeated temperature measurement with a fixedly predefined measuring frequency, i.e., with in each case an identical magnitude of the time intervals after which the respective next temperature measurement is performed, is that control operations can react to fast temperature changes possibly only in a delayed manner. Particularly on account of the slow temperature propagation in many dielectric materials and on account of the increase in the temperature gradient, the increase already being significant after a short time in the case of a temperature rise, and the end temperature reached in each case, it is possible, in the case of strictly periodic temperature measurement, for control countermeasures to be initiated only belatedly, under certain circumstances. If, by way of example, a temperature rise commences directly after the last temperature measured value was obtained, or only just starts to rise considerably at the measurement instant, with the result that it is not registered by the measurement, in such a case a considerably increased temperature is ascertained only after a considerable time interval. A further belatedness of possible countermeasures results from the fact that the temperature is measured at the location of the temperature measuring element and not necessarily in the region of the temporarily most greatly heated regions of the semiconductor memory. Thus, individual memory cells or memory areas may already be at a significantly higher temperature than the direct surroundings of a temperature measuring element, for example, a temperature diode.

Conversely, when the semiconductor memory is operated at a relatively constant temperature, the choice of a measurement interval that always remains constant for the temperature measurement has the disadvantage that in view of temperature measurements repeated unnecessarily often more current is consumed than necessary. This is disadvantageous precisely in mobile devices having a limited utilization period without an external current source. However, in the case of non-portable devices, the temperature measurement would actually need to be repeated only just often enough that the respective fastest temperature changes that occur are registered in good time and quantitively in terms of their markedness. Even the operating mode of a semiconductor memory, for instance, the self-refresh mode or the writing of data to memory cells or the read-out of data from the memory cells, causes an operating temperature of different magnitudes with, in each case, a different extent of possible temperature fluctuations. A fixed, uniform clock rate for the constantly renewed measurement of the operating temperature does not even satisfy the plurality of optionally activated operating modes of the semiconductor memory, but is only a compromise even within a specific operating mode.

Parameters other than the refresh rate could also be subsequently controlled or readjusted better by more accurate detection of the operating temperature. Finally, in nonvolatile semiconductor memories, control processes can be performed in a manner dependent on the operating temperature. For these, a temperature measurement that saves energy to a greater extent but at the same time is faster in reaction would be advantageous. A more powerful temperature measurement is gaining in importance also in view of the fact that typically a plurality of semiconductor memories such as DRAMs, for instance, can be mounted in a multi-chip package (MCP) and their operating temperatures can mutually influence one another. Since a plurality of semiconductor chips are arranged in direct proximity to one another in an MCP, the operating temperature of a semiconductor memory is greatly influenced by the operating mode of the further semiconductor memories.

The object of the present invention is to provide a semiconductor memory and a method for operating it which enable faster identification of relatively large temperature fluctuations if the latter occur and at the same time enable a more power-saving temporal tracking of the operating temperature in the case where the temperature of the semiconductor memory remains constant or is altered only to a small extent. The costs and the current consumption of a semiconductor memory for monitoring the operating temperature and possible consequential measures are intended to be kept as low as possible. Furthermore, for example, in the case of the refresh rate of a volatile semiconductor memory, the intention is to enable a more reliable adaptation of the refresh rate to the temporal profile of the temperature of the semiconductor memory.

This object is achieved according to an embodiment of the invention by means of an integrated semiconductor memory which has at least one temperature measuring element and repeatedly carries out a temperature measurement during the operation of the semiconductor memory. The semiconductor memory repeats the temperature measurement at instants corresponding to a measuring frequency of the temperature measuring element. The measuring frequency of the temperature measuring element is variable and the semiconductor memory drives the temperature measuring element in such a way that the measuring frequency changes in a manner dependent on the temporal development of measured values of the repeated temperature measurements.

An embodiment of the invention provides a semiconductor memory whose temperature measuring element is driven and connected up in such a way that it carries out the temperature measurement at instants with variable time intervals between the measurement instants. Consequently, at least in the case of temporally fluctuating temperature, the time intervals between successive temperature measurements are not equidistant, but rather vary in a manner dependent on the measured temperature. Particularly if the temperature of the semiconductor memory changes, the frequency of the temperature measurement can be adapted. Thus, relatively large temperature fluctuations resulting from the comparison of successively measured temperature values, for example, can bring about a shortening of the time duration until the respective next temperature measurement in the case of the semiconductor memory according to the invention.

The size of the time interval between two directly successive temperature measurements does not have to be fixedly correlated with a temperature value measured currently or shortly beforehand. According to the invention, it is merely provided that the period of time until the respective next temperature measurement is actually chosen variably in an altered fashion, to be precise, in a manner dependent on measurement results based on one or more temperature measurements carried out beforehand. Thus, according to an embodiment of the invention, the temperature measuring element is driven in such a way that its measuring frequency changes in a manner dependent on the temporal development of measured values of the repeated temperature measurements. Here the term measuring frequency is preferably intended to refer to a period of time which is short in each case and which typically needs to encompass only a small number of successive temperature measurements, possibly even also only the period of time until the very next temperature measurement.

The measuring frequency currently chosen in each case therefore corresponds at least to the reciprocal of the length of the clock cycle that results until the respective next temperature measurement, provided that all successive temperature measurements were performed at the same temporal spacing from one another. Consequently, at least the period of time until the instant at which the next temperature measurement is carried out is varied according to the invention in a manner dependent on one or more previously obtained measurement results of the temperature measurement. In the case of the control according to the invention of the temporal spacings of successive temperature measurements, however, the instants of a plurality of temperature measurements in the future can also be influenced by the measurement results currently present in each case. By way of example, it is conceivable that the temporal profile of the temperature is detected within a certain preceding time window and is averaged with respect to time and a measuring frequency that is only partly concomitantly influenced by subsequently obtained measurement results is coarsely predefined for a future time window.

The measuring frequency of a temperature measuring element is to be differentiated from the clock frequency (clock) with which a semiconductor memory is operated overall or at least supplied, either externally or by a clock signal generator on the semiconductor memory itself. By contrast, that frequency at which the temperature measuring element actually carries out repeated temperature measurements (and a measurement result is stored and/or evaluated within the semiconductor memory) is of importance for the present invention. The measuring frequency in this sense is determined from the temporal sequence of those instants at which measurement data which in each case reproduce a measured temperature directly (or indirectly, i.e., in converted form) are actually recorded and collected. Measurement results in this sense are also items of information which originate, for instance, from temperature comparisons with reference values or contain in some other way a qualitative or quantitative statement about the magnitude or the profile of temperature values.

A measuring frequency of the temperature measuring element (or of another structural unit of the semiconductor memory or of a temperature measuring device contained therein), the frequency being variable according to an embodiment of the invention, corresponds to the choice, adapted in a temperature-dependent manner, of the periods of time for temperature measurements to be carried out subsequently, at least until the very next imminent temperature measurement.

Another definition of measuring frequency is afforded by the term "duty cycle". Duty cycle denotes the pulse width ratio between on states (digital "1") and off states (digital "0") of a signal. This is understood to mean the relative pulse width of the on state, i.e., its relative temporal duration in comparison with the duration of the off state. The pulse width ratio can be related to an individual pulse or clock cycle (for example, of a transistor or some other switching element) or preferably be considered on average temporally over a relatively long period of time. In the latter case, in particular, the duty cycle specifies that proportion of the period of time considered during which the digital signal assumed the on state.

The duty cycle is occasionally specified by a natural number. A duty cycle of 1000 means, for instance, that a transistor (or some other switching unit), per 1000 time units during which it assumed the off state, assumed the on state during on average one time unit. More often, however, the duty cycle is specified in a percentage. In the above example, the duty cycle is 0.1%. A duty cycle of 10%, on the other hand, indicates that a signal assumes the on state for on average of 10% of the time or a corresponding signal is switched on during 10% of the period of time considered.

With regard to a measurement signal (for instance, with regard to a clock signal for a temperature measuring element or a temperature measuring device in which each pulse momentarily represents an on state having a constant temporal length that remains the same in each case (in this case, the pulse length is determined by the time duration between rising and falling clock edges)), the term duty cycle expresses indirectly how many on states, i.e., how many pulses, have occurred in a time interval considered. If a measuring operation (for instance, a temperature measurement) is instigated by such a signal having, in each case, identically short pulses but time intervals of different magnitudes between the pulses, then the duty cycle indirectly specifies the rate of occurrence of measuring (more generally the rate of occurrence of switching or the switching probability). In the case of a duty cycle of 10% or 0.1, a temperature measurement is actually carried out, for instance, only at every tenth instant at which the temperature measurement would be possible. The terms switching probability, rate of occurrence of switching, duty cycle and switching frequency can therefore be used interchangeably. With regard to the temperature measurement affected by an embodiment of the invention, the measuring frequency corresponds to the switching frequency and the rate of occurrence of measuring at which the temperature is actually measured and evaluated corresponds to the rate of occurrence of switching.

It is preferably provided that the measuring frequency of the temperature measuring element is controlled in such a way that it becomes greater, the faster the measured temperature of the semiconductor memory changes. This makes it possible to react more rapidly to severe and in particular sudden temperature fluctuations.

It is preferably provided that the temperature measuring element is driven in such a way that the measuring frequency of the temperature measuring element is increased in the case of increasing differences between successively determined measured values. Conversely, it is preferably likewise provided that the temperature measuring element is driven in such a way that the measuring frequency of the temperature measuring element is reduced in the case of decreasing differences between successive measured values. In accordance with the first-mentioned embodiment, increasing temperature fluctuations are detected more rapidly, with the result that consequential measures such as, for instance, the adaptation of the refresh rate to higher temperatures, in particular, can be effected more rapidly. Likewise, in the case of a rapid temperature decrease, the reduction of the refresh rate can be performed more rapidly. In addition, however, a temporal delay can also be defined, such that noncritical fluctuations in the direction of reduced temperature do not lead to a reduced measuring frequency as rapidly as fluctuations in the direction of increased temperatures, on the other hand, lead to an increase in the rate of occurrence of measuring. In accordance with the second embodiment mentioned above, in the case where the temperature remains approximately constant, the measuring frequency can be fixed at the ideal value in each case, at which the amount of energy consumed is not more than is necessary for the temperature measurement, but temperature changes becoming more critical are still detected in a timely manner.

It is preferably provided that the temperature measuring element is connected up in such a way that its measurement results are fed back to the temperature measuring element in order to influence the measuring frequency of the temperature measuring element. The feedback may be, for instance, an open-loop control or else a closed-loop control of the temperature measuring element by means of its own measurement results or by means of data values obtained indirectly therefrom.

It is preferably provided that the semiconductor memory has a clock generator, which predefines a clock signal for the measuring frequency of the temperature measuring element, wherein the clock frequency of the clock signal is variable. The clock signal determines the frequency that is presently to be adapted in each case for carrying out the respective next temperature measurements. However, the frequency can be altered again as early as after the very next measuring operation in order to react to renewed temperature alterations. One or a plurality of clock generators can be present, wherein in the latter case each clock generator can predefine a clock signal having in each case its own clock frequency.

It is preferably provided that the semiconductor memory has a feedback line, by means of which measured values of a temperature sensor are conducted to the clock generator. The feedback line may be formed from a plurality of individual lines which, for each measuring operation, alternatively also communicate two or even more data values to the clock generator or else to some other interposed unit. The feedback lines may be connected to a buffer, for example, in which the directly or indirectly obtained measurement results of the temperature measurements are stored at least temporarily.

It is preferably provided that the temperature measuring element, upon each temperature measurement, generates at least one measurement signal with a voltage, the magnitude of which depends on the magnitude of the measured temperature. The voltage is the voltage of the measurement signal itself, in this case, the measurement signal may be present in the form of an altered voltage or an altered potential. The temperature measuring element may be a bimetallic element, a temperature diode or any other, preferably integrated measuring element or temperature measurement. The voltage communicated by the measurement signal reproduces information about a measured temperature qualitatively or quantitatively. It is preferably provided that the semiconductor memory has at least one reference voltage generator, which outputs a reference signal with a predefined reference voltage. The reference voltage generator serves for supplying a comparison value for the voltage of the measurement signal with which the measurement signal can be compared. This serves in particular for determining whether a measured temperature lies above or below a certain desired value, limit value or other numerical value. During each temperature measurement, the temperature measuring element can in each case generate one measurement signal, alternatively also in each case two measurement signals with a temperature-dependent voltage (alternatively also an even greater number).

It is preferably provided that the reference voltage generator has a plurality of optionally tappable output terminals, wherein each output terminal outputs at least one reference signal of a different reference voltage. In particular, a plurality of output terminals are provided which in each case supply comparison voltages which supply a plurality of fixed temperature values on a temperature scale. Through comparison it can be ascertained in each case whether the measured temperature lies above or below the respective temperature value corresponding to the reference voltage supplied by the respective output terminal.

It is preferably provided that the semiconductor memory has at least one comparator, which compares the measurement signal of the temperature measuring element with at least one reference signal and outputs at least one difference signal. The comparator may also be fed a plurality of reference signals, for example, reference voltages, one after the other, the measurement signal in each case being fed simultaneously to another input of the comparator. Thus, each measured temperature value can be compared successively with a plurality of reference signals. The temperature sensor can be realized in a plurality of different configurations which are all suitable for obtaining in each case in an alternate order data values which in each case represent voltage differences with respect to alternately a next higher respective reference voltage and a next lower respective reference voltage. By way of example, precisely a single comparator may be provided, to which a sequence of measured values is fed, wherein every second measured value is compared with a respective comparison voltage that has previously been identified as the next higher reference voltage, and wherein all the remaining measured values are compared with a respective comparison voltage that has previously been identified as the next lower reference voltage. The criterion as to which reference voltage is the respectively next higher or next lower reference voltage may be, for example, a previous measured value, for example, the last measured value or (particularly in the case of alternate comparison with larger and smaller reference voltages) the penultimate measured value.

As an alternative, each measured value can in each case be compared with two different reference voltages (a smaller and a larger reference voltage) successively in the comparator; the measured value must be applied to a comparator input during both comparisons.

Finally, it is also possible for a pair of two comparators to be provided, both of which in each case obtain the same measured value. One comparator, for example, always compares the measured values with a next higher comparison voltage, whereas the other comparator always compares them with a next lower comparison voltage. The criterion for the selection of the next higher and next lower comparison voltage may be the same as indicated above.

Depending on the number and magnitude of the comparison values represented by the reference voltage for the temperature, the approximate magnitude of the temperature can be determined by classifying the measured voltage values into the scale of the reference voltages; this usually suffices for a suitable adaptation of the temperature measuring frequency and requires only small additional circuits on the chip.

It is preferably provided that the comparator, upon each temperature measurement, compares the measurement signal exclusively with those two reference signals which have the least voltage difference with respect to the voltage of the measurement signal of the respective previous temperature measurement, in particular the penultimate temperature measured value. This corresponds to the functioning of a tracking signal converter (for example, a tracking analog-to-digital converter) in which only the respective nearest reference voltages are monitored and, when both reference voltages are overshot (or undershot), the observation window is shifted upward or downward by one reference value.

It is preferably provided that the comparator, upon each temperature measurement, compares the measurement signal exclusively with those two reference signals in whose voltage interval lies the voltage of the measurement signal of the respective previous temperature measurement (in particular the penultimate temperature measured value). Consequently, if the voltage of the earlier measurement signal was between two reference voltages which are closest adjacent to one another and which are in each case provided by one of the output terminals of the reference voltage generator, then the renewed measured value firstly needs to be compared only with these two voltages.

It is preferably provided that the comparator alternately compares measurement signals firstly with a higher reference voltage and with a lower reference voltage. The higher reference voltage need only be greater than the lower reference voltage. Preferably, however, the two reference voltages are those which were identified as the respective closest adjacent reference voltage values with respect to an earlier (in particular last or penultimate) measured value.

It is preferably provided that the comparator forwards to the feedback line a sequence of data values specifying whether the respective reference voltage was overshot or undershot by the voltage of the measurement signal. Thus, it is possible, per temperature measurement, for example, to send two data values via the feedback line to the clock generator or a buffer connected upstream thereof.

Correspondingly, it is preferably provided that the semiconductor memory has a buffer, in which are buffer-stored data values for influencing the clock frequency of the temperature measuring element. It is preferably provided that the clock generator is connected downstream of the buffer. The buffer serves for temporarily storing the data values or any other signals, representing the measured temperature in some way, of one or more temperature measurements carried out last. The storage in the buffer takes place for the purpose of determining possible temperature fluctuations, in which case the temperatures obtained last or data values obtained therefrom can be combined computationally with one another in any desired form in order to obtain a statement about the temperature profile resulting from the last temperature values.

It is preferably provided that the buffer comprises a shift register, in which a plurality of data values of one or more temperature measurements carried out last are buffer-stored. The shift register preferably has a plurality of register stages through which the data values of successive measurements are transferred step by step or cyclically, the number of register stages preferably corresponding, down to an integral factor, for instance, 1, 2, or greater, to the number of those measurement instants whose measurement results are evaluated for observing the temperature profile and for observing the future frequency during the temperature measurement.

It is preferably provided that the buffer is connected upstream of a summer, which sums the data values stored in the buffer. In this case, it is possible to form the simple sum of the data values or alternatively a weighted sum, i.e., a more complex mathematical function that depends on the data values situated last in the buffer. This function may, in particular, weight the measured values of the very last measurement instant more heavily than the rest of the measured values. Thus, each measured value can be assigned a weighting factor that is smaller, the further back the associated measurement instant is.

It is preferably provided that the clock generator, when approximately, in each case, half of the data values stored in the shift register correspond to a digital "0" or a digital "1", predefines a comparatively low clock frequency and in the case of other distributions of the data values in the shift register, instigates an increase in the clock frequency of the temperature measuring element, which is greater, the greater the extent to which the distribution of the data values in the shift register deviates from a uniform distribution. If the shift register contains precisely the same number of data values "0" as data values "1", the measured value was just as often less than the next higher reference value or greater than the next lower reference value. Consequently, the position of the reference window has not shifted over the entire stored measurement time period; no or no appreciable temperature change is present. A relatively low temperature measuring frequency can accordingly be set.

It is preferably provided that the shift register has a plurality of register stages which are connected one downstream of another and between which the data values of a plurality of temperature measurements carried out last are forwarded.

It is preferably provided that the semiconductor memory has a reference signal generator having a plurality of optionally tappable output terminals, which can in each case be activated by an activation line connected to the clock generator. Furthermore, it is preferably provided that the clock generator, via the activation lines, in each case activates those output terminals of the reference signal generator whose reference voltages come closest to the last obtained voltage of the measurement signal, and deactivates the remaining reference signal generators. In this way, additional current can be saved during the temperature monitoring by virtue of only those reference signal generators with the instantaneous measured value of directly adjacent reference voltages remaining activated. Furthermore, further elements of the temperature measuring device, for example, the comparator or the temperature measuring element itself, can be driven via activation lines which momentarily activate these further components in each case only at the required instant, in order to save current.

It is preferably provided that the semiconductor memory is a volatile memory component. It may be a DRAM, for example, comprising a memory cell array whose memory cells contain selection transistors and storage capacitors.

It is preferably provided that the semiconductor memory varies the refresh rate of volatile memory cells in a manner dependent on the measurement results of the temperature measurement. The refresh rate can be predicted, for example, depending on the temperature to be expected, for instance, according to a predicted temperature value. The measured values from the temperature measurements (or other signals that represent the temperatures directly or indirectly) need not influence the respective refresh rate directly; even the more accurate detection of unexpected, sudden temperature fluctuations by means of the frequency, which is dependent on the temperature profile according to the invention, of the temperature measurement itself already enables countermeasures to be taken more effectively in the choice of the refresh rate. A more extensive influencing of the refresh rate may additionally be provided, however. Furthermore, any desired other parameter can also be controlled more precisely with the aid of the temperature measurement developed according to the invention. Furthermore, it is also possible to provide nonvolatile semiconductor memories having the temperature measurement improved according to the invention.

The object on which the invention is based is furthermore achieved by means of a method for operating an integrated semiconductor memory, wherein the method comprises repeated measurement of the temperature of a semiconductor memory during the operation of the semiconductor memory by a temperature measuring element, wherein the temperature measurement is repeated at a multiplicity of instants corresponding to a measuring frequency of the temperature measuring element, and wherein the measuring frequency of the temperature measuring element is varied in a manner dependent on a temporal development of measured values of a sequence of temperature measurements.

It is preferably provided that the measuring frequency of the temperature measuring element is increased if the measured values indicate an accelerated temperature variation. In particular, it is provided that the measuring frequency of the temperature measuring element is increased to a greater extent, the greater the difference between measured values of successive temperature measurements. Preferably, the increase in the measuring frequency is effected immediately, that is to say that the next measurement is already effected prematurely or earlier than actually envisaged in accordance with the instantaneous measuring frequency.

It is preferably provided that the measuring frequency of the temperature measuring element is reduced in the case of decreasing temperature variation. In this case, the measuring frequency can be reduced either immediately or alternatively with a certain delay, in order to wait and see whether the retardation of the temperature change persists further. In this way, reaction times of different rapidity to temperature changes in the direction of increasing or decreasing temperature can be combined with one another.

It is preferably provided that the measurement results of the temperature measurements are fed back to a temperature sensor in order to influence the measuring frequency of a temperature measuring element situated in the temperature sensor. The measurement results can also be fed back again indirectly, that is to say in converted form, whereby the measuring frequency is altered in a temperature-dependent manner.

It is preferably provided that a clock signal having a variable clock frequency is fed to a temperature sensor by a clock generator. By way of example, it is possible to provide a plurality of clock generators for clock signals having different clock frequencies, one clock generator of which, in each case, is activated in order to feed the clock signal of the corresponding, suitable frequency to the temperature measuring element or a unit containing the latter.

It is preferably provided that a voltage dependent on the respectively measured temperature is generated with the aid of the temperature measuring element. The voltage is preferably compared with at least one, but preferably a plurality of reference voltages. In accordance with one particular preferred embodiment, more than two output terminals of the at least one reference voltage generator which can generate more than two different reference voltages are provided in the semiconductor memory. All the reference voltages preferably have different magnitudes.

Preferably, each voltage value of the measurement signal that is obtained during a temperature measurement is compared with precisely two reference voltages, to be precise with those two reference voltages which have the least voltage difference with respect to the voltage of the measurement signal. Consequently, the voltage value of the measurement signal lies in the interval between these two closest reference voltages. A comparison with each of these two reference voltages suffices to ascertain whether as before the higher reference voltage is undershot and the lower reference voltage is overshot. However, if both reference voltages are overshot (or undershot), it is necessary to choose a different pair of reference voltages that are more closely adjacent to the instantaneous voltage value of the measurement signal.

Preferably, the measurement results of the temperature measurements are buffer-stored in a buffer, preferably in a shift register having a plurality of register stages connected one downstream of another. The measurement results are preferably buffer-stored in the form of data values that were obtained for instance with the aid of a comparator and in each case specify whether a reference value (for example, a reference voltage in the case of voltage values obtained from the measurement signal) was overshot or undershot. A digital one may, for example, represent the overshooting of a reference signal; a digital zero may correspondingly represent an undershooting of a reference voltage.

Preferably, two data values are stored for each measurement instant, namely those data values which indicate whether the next higher reference value and the next lower reference value were overshot or undershot. The measured values can be stored in the shift register for a plurality of a number n of temperature measurements performed last and can be added (or be summed in weighted fashion after multiplication by respective weighting factors). In this way, an evaluation function is calculated which influences the future clock frequency and hence the instant of the next temperature measurement.

With the aid of a rate of occurrence of measuring or measuring frequency of the temperature measurement that is controlled in a temperature-dependent manner according to the invention, it is possible, in particular, for the refresh rate of volatile memory cells of the semiconductor memory to be adapted to a variable operating temperature of the semiconductor memory even more precisely and in a manner that saves more costs than conventionally. As an alternative, it is possible for any other parameter to be controlled in a temperature-dependent manner more precisely and more cost-effectively or for some other control operation to be carried out more efficiently.

BRIEF DESCRIPTION OF THE DRAWINGS

Embodiments of the invention are described below with reference to the figures, in which.

DETAILED DESCRIPTION OF ILLUSTRATIVE EMBODIMENTS

Figure 1:
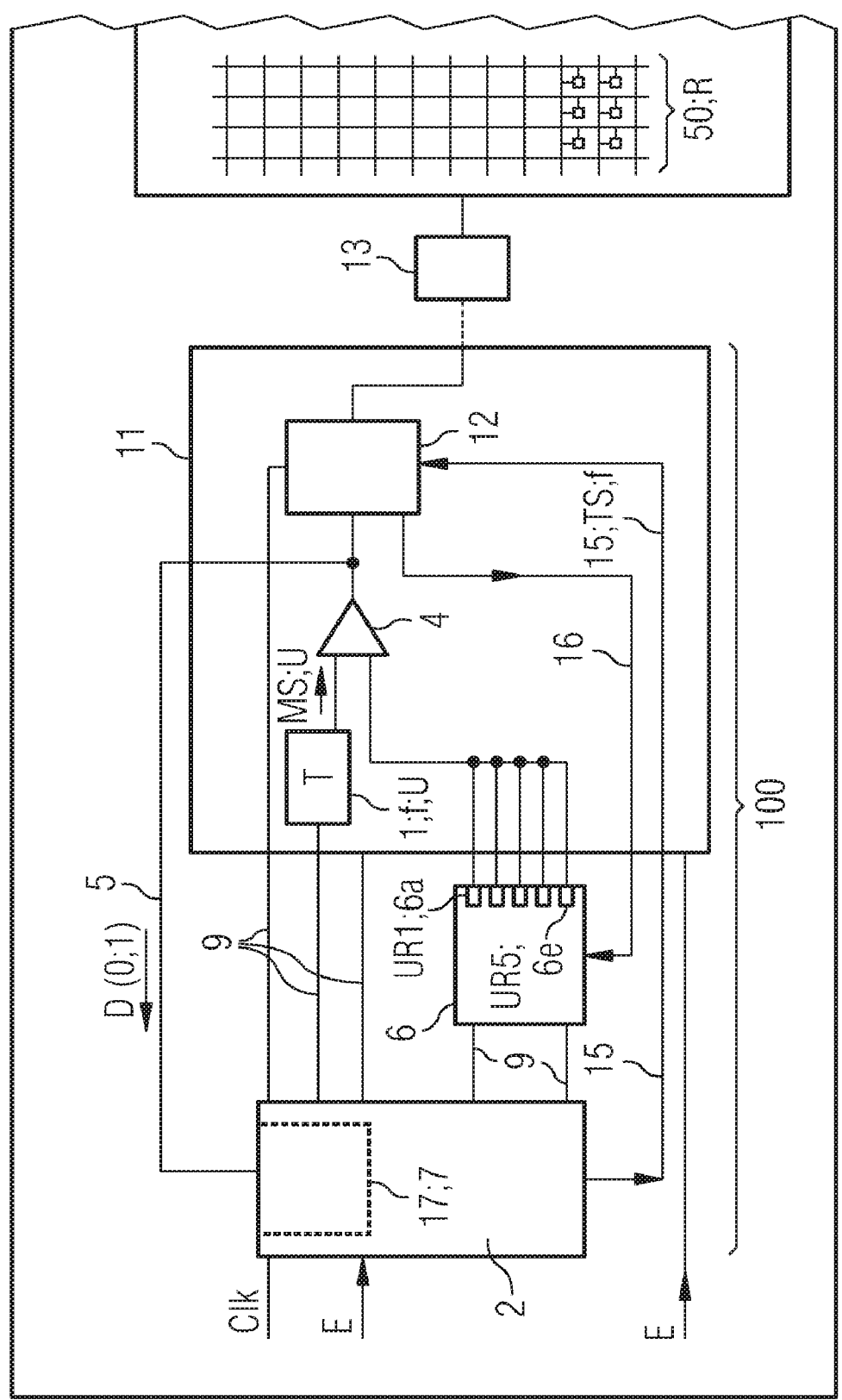
FIG. 1 shows a schematic plan view of a semiconductor memory according to the invention.

FIG. 1 shows a schematic plan view of a semiconductor memory 10 according to an embodiment of the invention, having a temperature sensor 11 having at least one temperature measuring element 1, which serves for measuring a local temperature T of the semiconductor memory 10 and is operated by the temperature sensor 11 with a temperature-dependent clock frequency f. The temperature measuring element may be formed, for example, as a bimetallic element or as a temperature semiconductor diode. The temperature measuring element 1 may be, in particular, part of a temperature sensor 11 comprising even further components and switching units (for instance a comparator 4 and a digital switching unit 12). The temperature measuring element 1 supplies a measurement signal MS, preferably in the form of a voltage U, which is correlated with the measured temperature T of the semiconductor chip 10. The magnitude of the voltage U therefore reproduces the measured temperature T.

FIG. 1 illustrates only one of the possible embodiments of a semiconductor memory according to the invention. In the specific embodiment illustrated in FIG. 1, a measurement signal MS of the temperature measuring element 1 that is present in the form of a voltage U is conducted to at least one comparator 4, in which the measurement signal is compared with a reference voltage or successively or simultaneously with a plurality of reference voltages UR, for example, precisely two reference voltages UR. The reference voltages UR are provided by the reference voltage generator 6. Preferably, provision is made of a plurality of several, for example, five output terminals $6a, \ldots, 6e$ of the reference voltage generator 6 which supply a plurality of mutually different reference voltages UR1 to UR5. One of the reference voltages in each case is conducted to a further input of the comparator 4, where it is compared with the measurement signal MS of the voltage U that is present simultaneously at the first comparator input. The comparator outputs a digital signal in the form of a logic 0 or 1, indicating whether the value of the respectively compared reference voltage UR was undershot or overshot by the voltage U. The digital signal is conditioned by means of a first, preferably digital switching unit 12 and sent to further areas of the semiconductor memory 10 in order to control a parameter in a temperature-dependent manner there, for example, the refresh rate R of one of volatile memory cells 50, or in order to carry out an arbitrary other control process in a temperature-dependent manner.

In the exemplary case illustrated in which the refresh rate R of memory cells of a memory cell array is to be controlled in a temperature-dependent manner, the signal output by the first switching unit 12 can be conducted to a second switching unit 13 for temperature-dependent control of the refresh rate R and can then be used for controlling the refresh rate R of the memory cells 50. The memory cells 50 are in each case connected to one of many word lines and to one of many bit lines, which are only illustrated schematically in FIG. 1. The memory cells, which are likewise only illustrated schematically, may be, for example, DRAM memory cells each having a selection transistor and a storage capacitor, for instance, a trench capacitor or stacked capacitor. Despite the possibility of controlling the refresh rate R or refresh time of memory cells in a temperature-dependent manner, the measurement result of the temperature measuring unit 100, which is only illustrated schematically in FIG. 1, can also be used for any other control operation which is to be carried out in a manner dependent on a measured temperature and the temporal profile thereof.

FIG. 1 illustrates a feedback line 5, which forwards the data output by the at least one comparator 4, to be precise to a clock generator 2 or to a buffer 17 connected upstream of or integrated into the latter. Digital data values D are forwarded along the feedback line 5, to be precise, in each case, one or a plurality (for instance precisely two) of data values D for each measurement instant. These data preferably comprise digital data values, namely the data bits "0" or "1". The buffer 17 may be formed as a shift register 7, for example, which has a multiplicity of register stages which are connected one downstream of another and through which the data values are conducted cyclically. The data values recorded and stored during some last measurement instants serve for determining the future clock rate of the temperature measuring element 1, that is to say the temporal spacing of successive further temperature measurements, anew on the basis of the resultant temporal profile of the measured temperature. The data values D can also be conducted directly to the clock generator 2. Furthermore, the clock generator may comprise the buffer 17. Activation lines 9 proceed from the clock generator 2, and some of the lines lead to the reference voltage generator 6. The reference voltage generator, which may have a plurality of output terminals $6a, \ldots, 6e$ in accordance with FIG. 1, is thus operated cyclically by the clock generator 2. Preferably, the various subcircuits (not illustrated separately) of the clock generator whose output terminals $6a, \ldots, 6e$ in each case output one of the reference voltages are activated only in each case when and only for as long as they are to provide the respective reference voltage UR which is to be compared with the voltage U of the measurement signal MS in the comparator 4. In the meantime, subcircuits of the reference voltage generator that are currently not required can be kept deactivated via the respective remaining activation lines 9.

The temperature measuring unit 100 illustrated by way of example in FIG. 1 can be supplied with external data E with regard to the temperature measuring unit 100. The external data E are preferably provided by the semiconductor memory 10 itself and comprise input data control signals, for example. The external data E can be sent, for example, to the clock generator 2 or to a subunit of the temperature measuring unit 100, as illustrated in FIG. 1.

Figure 2:
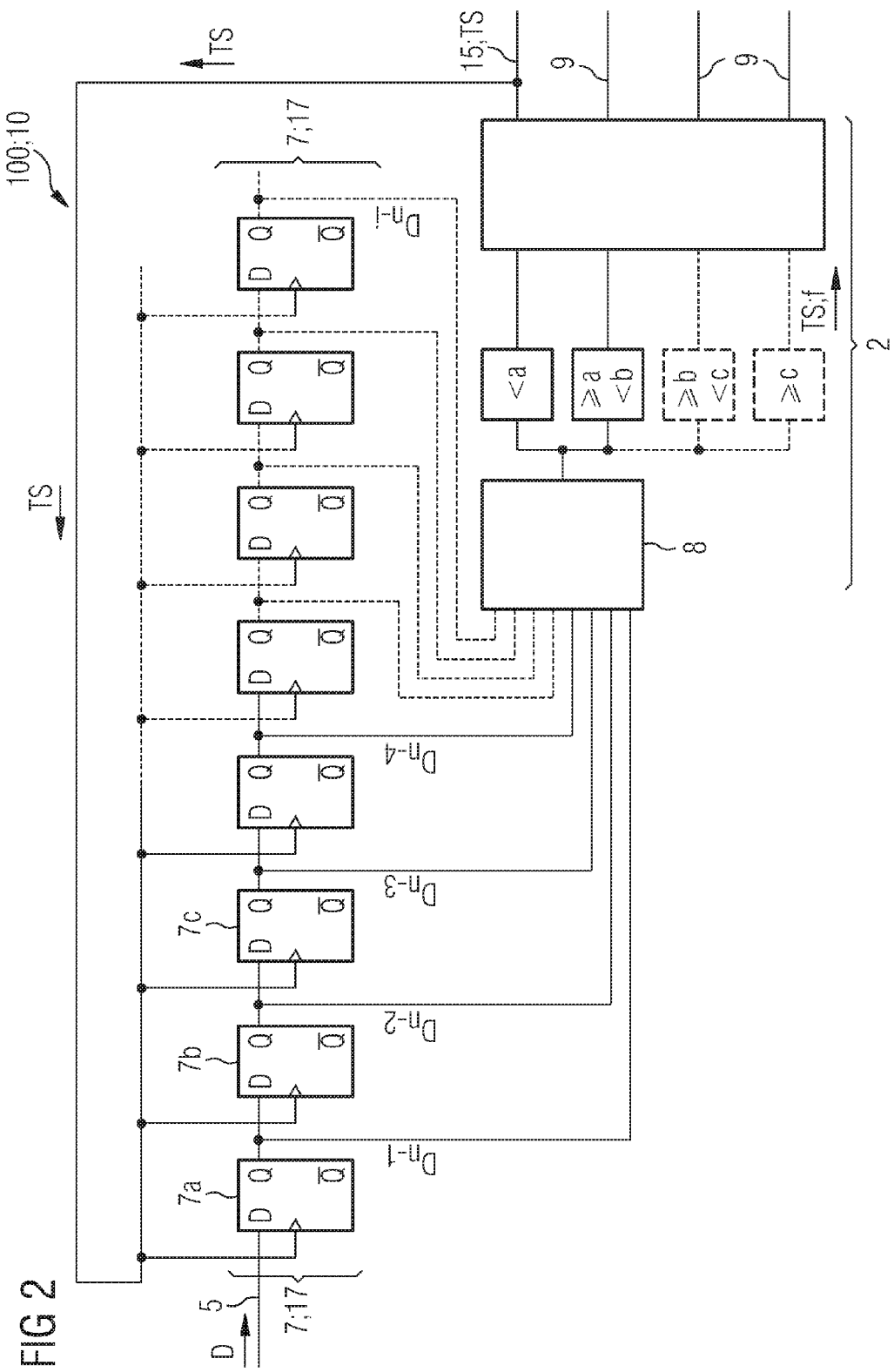
FIG. 2 shows a detail view of the semiconductor memory from FIG. 1.

FIG. 2 shows a schematic detail view of the temperature measuring unit 100 of the semiconductor memory 10. The illustration shows a clock generator 2 with the activation lines 9 connected thereto and also a buffer 17, which is preferably formed as a shift register 7 and has a plurality of register stages 7a, 7b, 7c, .... By way of example, four or eight register stages may be provided which buffer-store the data values of a plurality of last preceding measurement instants and forward them to a summer 8 of the buffer 17. By way of example, the data value of the last measurement instant, that is to say the data value $D_{n-1}$, is buffer-stored in a first shift register 7a and, in the event of forwarding to the next, second register stage 7b, is simultaneously forwarded to the summer 8 via a corresponding data line. Likewise, at the same instant when the data values $D_{n-1}$ obtained last are stored in the first register stage 7a, the data values $D_{n-1}$ obtained at the penultimate measurement instant are stored in the second register stage 7b and only in the event of forwarding to the third register stage 7c are forwarded and simultaneously forwarded to the summer 8 via a corresponding data line. At every instant, data values of a fixed number of preceding measurement instants are present in the summer 8, for example, the measurement results of the last four or eight temperature measurements. The summer calculates an evaluation function that leads to the definition of a future measuring rate for the temperature measurement, that is to say to a definition of the future measuring frequency f of the temperature measuring element 1. Consequently, a clock signal TS of a previously calculated frequency f is forwarded and finally passed on as far as the activation lines 9. An appropriate clock frequency f for the clock signal TS is chosen depending on whether the temperature fluctuation that was calculated in the summer 8 undershoots or overshoots certain limit values a, b, c, .... In a downstream unit, which is only illustrated schematically in FIG. 2, activation lines 9 are activated or deactivated depending on which reference voltages of the reference voltage generator 6 are respectively required.

The clock signal is conducted via the clock signal line 15 to the temperature sensor 11, in particular to the digital switching unit 12 thereof, with the result that the temperature sensor 11 is operated at this clock rate at least until the next clock cycle or measurement instant. The clock signal line 15 preferably leads directly to a digital switching unit 12 of the temperature sensor 11. Furthermore, a signal feedback line 16 is preferably provided, which leads from the digital switching unit 12 to the reference voltage generator 6 and controls which of the subcircuits of the reference voltage generator 6 are in each case kept activated, that is to say which respective reference voltages are kept ready in each case. The selective operation of exclusively the subcircuits that are currently required saves power. Correspondingly, for further saving of power, it is also possible for the temperature measuring element 1, the comparator 4 and/or the switching unit 12 to be connected to dedicated activation lines 9 via which they are momentarily activated only for as long as necessary and as often as necessary. It goes without saying that the concrete configurations of the temperature measuring unit 100 and their constituent parts may be formed and arranged differently than illustrated in FIGS. 1 and 2.

Figure 3:
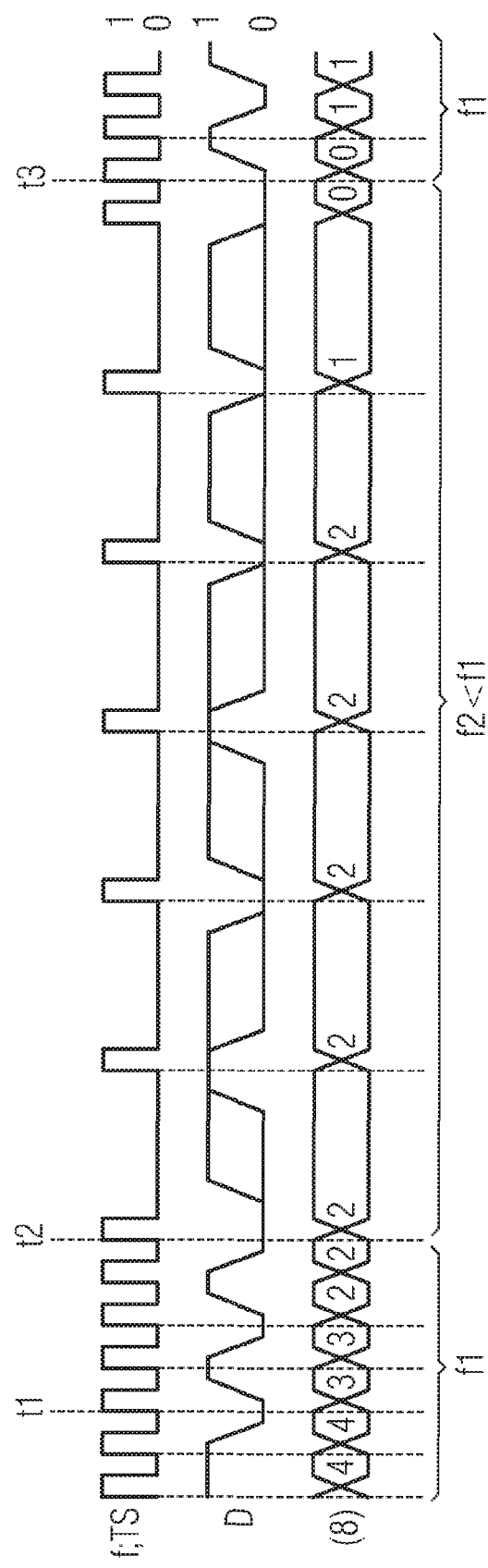
FIG. 3 shows the temporal profile of a clock signal for a concrete sequence of data values.

FIG. 3 shows by way of example the temporal profile of the clock frequency of a clock signal for the temperature measuring element. The clock signal TS is illustrated at the top in FIG. 3 and is represented by a function corresponding to a digital signal. In a first period of time up to an instant t2, the clock signal TS has a relatively high frequency f, which may correspond to a maximum frequency Fmax, for example. It is noted as a precaution that the clock frequency f and the clock signal TS discussed here are intended for the temperature measuring element 1 and are therefore to be differentiated from the clock signal Clk (FIG. 1) with which the semiconductor memory 10 overall and its subunits are clocked. The clock frequency of the clock signal TS for the temperature measuring element 1 is much lower, but can be varied in a temperature-dependent manner according to the invention. FIG. 3 shows that the frequency f of the clock signal TS is reduced significantly between the instants t2 and t3. This is attributed to the fact that only slight temperature fluctuations were determined during the previous measurement instants, with the result that a further temperature observation with a relatively low measuring frequency f of the temperature measuring element 1 (or the clock signal TS) is entirely sufficient for detecting recent temperature fluctuations.

The signal profile illustrated in the middle of FIG. 3 shows by way of example a possible sequence of data values D for a series of a plurality of temperature measurements. The digital data value D always assumes the value either of a logic 1 or of a logic 0; in reality the clock edges have a steeper profile than illustrated in FIG. 3. Regions in which the signal profile splits into two partial curves identify various possible signal profiles which, in the exemplary embodiment of FIG. 3, all lead to the same result with regard to the future clock frequency ultimately determined for the temperature measuring element. In FIG. 3, vertical dashed lines represent those instants at which a data value D is in each case forwarded via the feedback line 5 or some other corresponding line. In this case, precisely two digital data values D correspond to each measurement instant at which a temperature measurement was carried out by the temperature measuring element, the digital data values being assigned to the measurement instant. This results from the fact that, in accordance with one preferred embodiment, the voltage U of each measurement signal MS (FIG. 1) is compared with precisely two reference voltages UR having the smallest voltage difference with respect to the voltage U. Consequently, for each measured temperature value T (that is to say for each voltage value U obtained by the temperature measuring element 1), a pair of data values D (for example D1 and D2 for the respective measurement instant) is calculated and forwarded, the two data values specifying whether the next lower reference voltage was overshot and whether the next higher reference voltage was overshot. In the case of an essentially stagnating temperature or in the case of only small temperature fluctuations, it is to be expected that the voltage value U still lies in the voltage interval defined by the two reference voltages and therefore precisely one data value of the pair assumes the value 0 and the other data value assumes the value 1. This profile is discernable in the middle signal profile illustrated in FIG. 3; the sequence of data values D alternates between the values 0 and 1 at least up to the instant t2. Moreover, it alternates at very high frequency since the measuring frequency is relatively high up to the instant t2.

The bottommost signal profile in FIG. 3 reproduces the evaluation result of the summer (or weighting or non-weighting adder) 8; the sum of the respective two data values D for the last two preceding measurement instants is represented. These data values are stored in a four-bit shift register, for instance, to mention just one possible conceivable embodiment. On account of a preceding relatively large temperature fluctuation, the sum of the data values stored before the instant t1 equates to the value of 4, that is to say that all four stored bits assume the value 1. This means that at both preceding measurement instants, not only the lower but also the upper closest reference voltages were overshot both times, that is to say at both measurement instants. This indicates a relatively large temperature change, for which reason the frequency f of the clock signal TS is initially high. At the instant t, however, the data value D assumes the value 0, that is to say that the upper reference voltage was evidently undershot. This means that the sum of the data values stored in the shift register decreases by 1 to the value 3, which is found in the evaluation result of the summer in the lower part of FIG. 3. At the next instant, too, the next higher reference voltage value is undershot again since the profile of the data values D decreases to the value 0 again, whereby the sum of the four stored data bits decreases to 2. At the subsequent clock time t2, therefore, the measuring frequency f of the clock signal TS is significantly reduced since the value 2 calculated by the summer 8 means that precisely half of the four stored data bits assume the value 1, which indicates a stagnating or at most slightly varying temperature of the semiconductor memory. A temperature measurement with a reduced measuring frequency therefore suffices until further notice. Accordingly, the f2 chosen after the instant t2 is less than the frequency f1 used previously. It is only at a later instant (one clock cycle before the instant t3) that the data value repeatedly assumes the value 0 and the evaluation function calculated by the summer 8 decreases firstly to the value 1 and then to the value 0. This means that the next lower reference voltage value was then undershot, with the result that, starting from the instant t3, a temperature measurement with an increased frequency f1 is instigated in order to track close to the time the temperature decrease that has evidently become greater and, for example, to be able to lower the refresh rate of the memory cells or modulate other parameters earlier.

Figure 4:
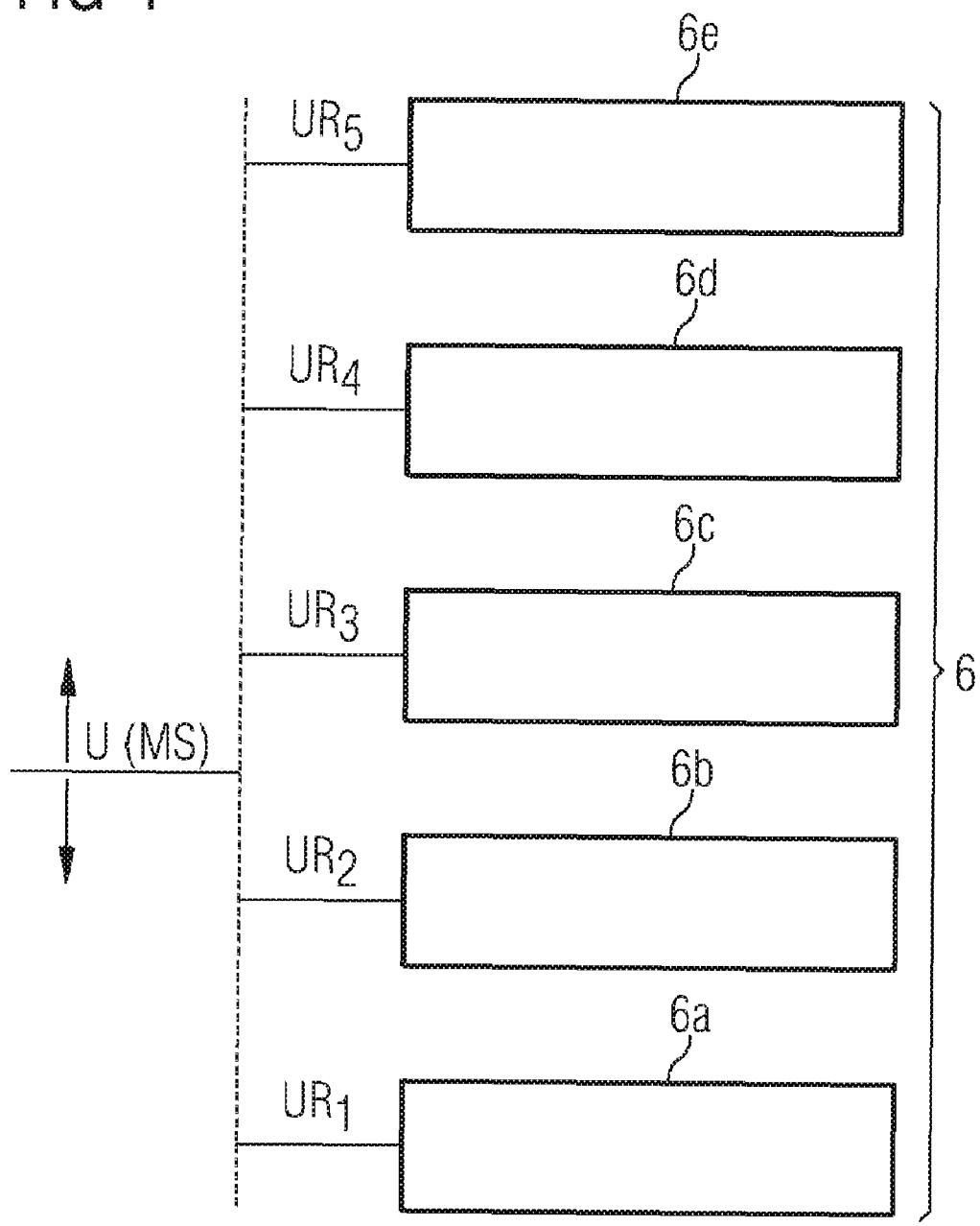
FIG. 4 shows a schematic illustration of the magnitude of the voltage of a measurement signal of the temperature measuring element in comparison with a plurality of reference voltages.

FIG. 4 schematically shows the magnitude of the voltage U of the measurement signal MS and the magnitude of a plurality of reference voltages UR provided by at least one voltage generator 6 having a plurality of output terminals 6a to 6e. FIG. 4 is based on a schematic voltage scale in which those voltage generators 6 which generate the highest reference voltage values UR are represented furthest at the top in FIG. 4. Thus, the reference voltage generator supplies at its output terminal 6e a reference voltage UR5 that is higher than the reference voltages of the remaining four output terminals of the reference voltage generator. The voltage value U of the measurement signal MS that is to be compared needs to be classified into the voltage intervals between the two adjacent reference voltages in each case. If, by way of example, it lies between the reference voltages UR2 and UR3 as illustrated, then the comparator, upon comparison with these voltage values, yields firstly the data value 1 and then the data value 0. This corresponds to the customary profile of the profile of the temperature T that is represented by the data values D. Provided that no significant temperature changes occur, the voltage value U remains within the interval between the reference voltages UR2 and UR3, such that subcircuits of the reference voltage generator for the rest of the reference voltages can remain deactivated during this time. Only if the voltage U becomes greater than the reference voltage UR3 is it necessary for the output terminal 6d of the reference voltage generator to be activated and for the next higher reference voltage value UR4 thereby to be provided in order to be able to carry out monitoring in a comparison interval shifted toward higher voltages. In this way, a tracking analog-to-digital converter can be used for saving power during the operation of the reference voltage generator.

Figure 5:
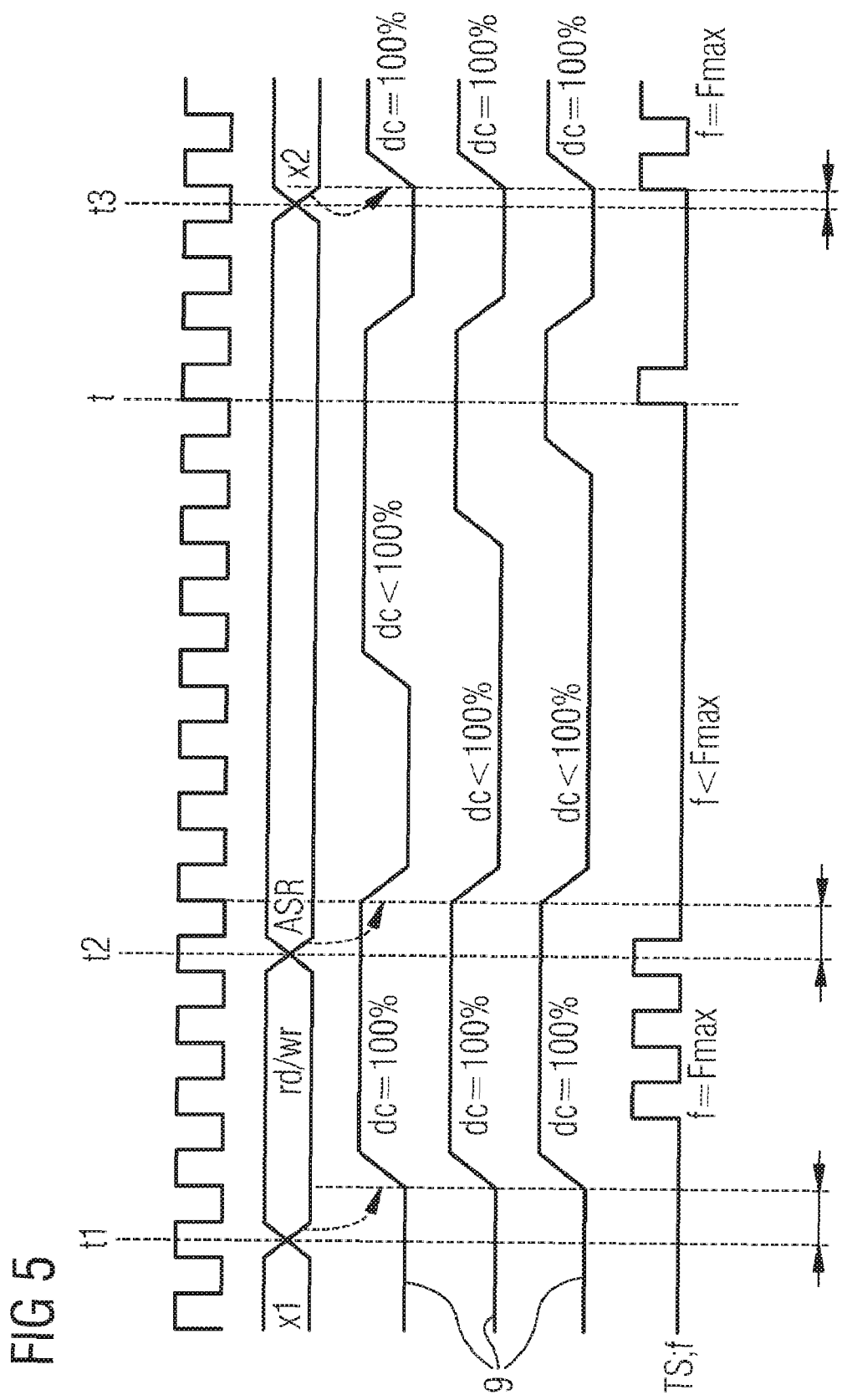
FIG. 5 shows a further example of a signal profile of a clock signal having a variable clock frequency.

Finally, FIG. 5 shows a further exemplary embodiment of the signal profile of a clock signal TS, the clock frequency f of which can be altered in a manner dependent on the measured temperature T. Firstly, a clock signal having a temporally constant frequency and a continuously uniform period duration is illustrated at the top in FIG. 5. Up to an instant t1, the semiconductor memory is in a first operating state x1, then changes to an operating state rd/wr, in which read commands and write commands are executed and the current consumption and temperature fluctuations may therefore turn out to be significantly higher. After the instant t2, the semiconductor memory changes to the operating state ASR, which identifies an auto-self-refresh mode, in which any already stored data values are refreshed in the memory cell array. Therefore, only slight temperature fluctuations and power losses are to be expected up to the instant t3. After the instant t3, the semiconductor memory assumes a further operating state x2. In FIG. 5, on the basis of a plurality of activation lines 9, their respective signal level is represented and the value of the duty cycle "dc" to which the potential profile of the respective activation line corresponds is furthermore specified. A duty cycle of 100% means that the maximum rate of occurrence of switching has been set and the corresponding activation line is therefore clocked as often as at all possible in accordance with the topmost signal curve illustrated in FIG. 5.

All the activation lines 9 remain activated in the period of time t1 to t2; corresponding to a duty cycle of 100%. This means that all units, that is to say the comparator, the temperature measuring element and a plurality or even all of the outputs of the reference voltage generator, remain activated in order to be able to react rapidly to possible rapidly occurring temperature fluctuations. After the instant t2, the frequency f of the clock signal TS for the temperature measuring element is significantly reduced, however, to far below the maximum clock frequency Fmax, since no significant temperature changes are to be expected in this operating state rd/wr. At longer time intervals shortly before the respective next clock cycle, in which the next clock counting pulse of the clock signal TS follows in the operating state rd/wr, a plurality of activation lines 9 are activated successively in order to be able to carry out a measurement and a comparison with both reference voltages in the comparator at the corresponding instant t. In the new operating state x2, the frequency f of the clock signal TS is then increased significantly again starting from the instant t3. The double arrows that face one another and are illustrated in FIG. 5 indicate the time windows of the signal profiles in which a temporal synchronization could be required due to unintended signal jumps ("spike" or "glitch") in which, before a signal value 0 that is to be expected, signal value 1 is momentarily assumed (spike) or, before a signal value 1 that is to be expected, the value 0 is momentarily assumed (glitch), the data value is corrupted by parasitic signal edges.

The present invention can in particular be used to adapt in particular the refresh rate R of volatile memory cells to a changed temperature of the semiconductor memory even more rapidly and earlier. Likewise, it is also possible for other parameters or more complex control operations to be adapted to the ambient temperature more efficiently and more rapidly. The invention can furthermore also be used in nonvolatile semiconductor memories.

What is claimed is:

1. An integrated semiconductor memory that has at least one temperature measuring element and repeatedly carries out a temperature measurement during operation of the integrated semiconductor memory, wherein the integrated semiconductor memory repeats the temperature measurement at instants corresponding to a measuring frequency of the temperature measuring element, wherein the measuring frequency of the temperature measuring element is variable, and wherein the integrated semiconductor memory drives the temperature measuring element in such a way that the measuring frequency changes in a manner dependent on the temporal development of measured values of repeated temperature measurements.

2. The integrated semiconductor memory as claimed in claim 1, wherein the measuring frequency of the temperature measuring element is controlled in such a way that it becomes greater, the faster the measured temperature of the integrated semiconductor memory changes.

3. The integrated semiconductor memory as claimed in claim 1, wherein the temperature measuring element is driven in such a way that the measuring frequency of the temperature measuring element is increased in the case of increasing differences between temporally successively determined measured values for the temperature.

4. The integrated semiconductor memory as claimed in claim 1, wherein the temperature measuring element is driven in such a way that the measuring frequency of the temperature measuring element is reduced in the case of decreasing differences between temporally successively determined measured values for the temperature.

5. The integrated semiconductor memory as claimed in claim 1, wherein the temperature measuring element is connected in such a way that measurement results are fed back to the temperature measuring element in order to influence the measuring frequency of the temperature measuring element.

6. The integrated semiconductor memory as claimed in claim 1, wherein the integrated semiconductor memory has a clock generator, which predefines a clock signal for the measuring frequency of the temperature measuring element, wherein the clock frequency of the clock signal is variable.

7. The integrated semiconductor memory as claimed in claim 6, wherein the semiconductor memory has a feedback line, by means of which measured values of a temperature sensor are conducted to the clock generator.

8. The integrated semiconductor memory as claimed in claim 1, wherein the temperature measuring element, upon each temperature measurement, generates at least one measurement signal with a voltage, the magnitude of which depends on the magnitude of the measured temperature.

9. The integrated semiconductor memory as claimed in claim 1, wherein the semiconductor memory has at least one reference voltage generator, which outputs a reference signal with a predefined reference voltage.

10. The integrated semiconductor memory as claimed in claim 9, wherein the reference voltage generator has a plurality of optionally tappable output terminals, each of which outputs a reference signal with a different reference voltage.

11. The integrated semiconductor memory as claimed in claim 1, wherein the semiconductor memory has at least one comparator, which compares the measurement signal of the temperature measuring element with at least one reference signal and outputs a difference signal.

12. The integrated semiconductor memory as claimed in claim 11, wherein the comparator in each case outputs a difference signal indicating whether the voltage of the measurement signal is greater or less than the respective reference voltage.

13. The integrated semiconductor memory as claimed in claim 11, wherein the comparator, upon each temperature measurement, compares the measurement signal exclusively with those two reference signals which have the least voltage difference with respect to the voltage of the measurement signal of the previous temperature measurement.

14. The integrated semiconductor memory as claimed in claim 11, wherein the comparator, upon each temperature measurement, compares the measurement signal exclusively with those two reference signals between whose voltage interval lies the voltage of the measurement signal of the previous temperature measurement.

15. The integrated semiconductor memory as claimed in claim 11, wherein the comparator alternately compares measurement signals with a higher reference voltage and with a lower reference voltage.

16. The integrated semiconductor memory as claimed in claim 11, wherein the comparator forwards to the feedback line a sequence of data values specifying whether the respective reference voltage was overshot or undershot by the voltage of the measurement signal.

17. The integrated semiconductor memory as claimed in claim 16, wherein the semiconductor memory has a buffer, in which are buffer-stored the data values for influencing the clock frequency of the temperature measuring element.

18. The integrated semiconductor memory as claimed in claim 17, wherein the clock generator is connected downstream of the buffer.

19. The integrated semiconductor memory as claimed in claim 17, wherein the buffer comprises a shift register, in which a plurality of data values of one or more temperature measurements carried out last are buffer-stored.

20. The integrated semiconductor memory as claimed in claim 17, wherein the buffer is connected upstream of a summer, which sums the data values stored in the buffer.

21. The integrated semiconductor memory as claimed in claim 19, wherein the clock generator, when approximately in each case half of the data values stored in the shift register correspond to a digital "0" and to a digital "1", predefines a comparatively low clock frequency and, in the case of other distributions of the data values in the shift register, instigates an increase in the clock frequency of the temperature measuring element, which is greater, the greater the extent to which the distribution of the data values in the shift register deviates from a uniform distribution.

22. The integrated semiconductor memory as claimed in claim 19, wherein the shift register has a plurality of register stages, which are connected one downstream of another and between which the data values of a plurality of temperature measurements carried out last are forwarded.

23. The integrated semiconductor memory as claimed in claim 1, wherein the semiconductor memory has a reference signal generator having a plurality of optionally tappable output terminals, which can in each case be activated by an activation line connected to the clock generator.

24. The integrated semiconductor memory as claimed in claim 23, wherein the clock generator, via the activation lines, in each case activates those output terminals of the reference signal generator whose reference voltages come closest to the last obtained voltage of the measurement signal, and deactivates the remaining output terminals of the reference signal generator.

25. The integrated semiconductor memory as claimed in claim 1, wherein the semiconductor memory is a volatile semiconductor memory.

26. The integrated semiconductor memory as claimed in claim 1, wherein the semiconductor memory has a plurality of volatile memory cells, and the semiconductor memory varies a refresh rate of the volatile memory cells in a manner dependent on the measured temperature.

27. The integrated semiconductor memory as claimed in claim 1, wherein the semiconductor memory is integrated into an arrangement of a plurality of semiconductor memories of identical type each having their own temperature measuring element.

28. A method for operating an integrated semiconductor memory, the method comprising:
   repeated measurement of a temperature of the semiconductor memory during operation of the semiconductor memory by at least one temperature measuring element;
   wherein the temperature measurement is repeated at a multiplicity of instants corresponding to a measuring frequency of the temperature measuring element; and
   wherein the measuring frequency of the temperature measuring element is varied in a manner dependent on a temporal development of measured values of a sequence of temperature measurements.

29. The method as claimed in claim 28, wherein the measuring frequency of the temperature measuring element is increased if the measured values indicate an accelerated temperature variation.

30. The method as claimed in claim 28, wherein the measuring frequency of the temperature measuring element is increased to a greater extent, the greater the difference between measured values of successive temperature measurements.

31. The method as claimed in claim 28, wherein the measuring frequency of the temperature measuring element is reduced in the case of decreasing temperature variation.

32. The method as claimed in claim 28, wherein the measurement results of the temperature measurements are fed back to a temperature sensor in order to influence the measuring frequency of the temperature measuring element situated in the temperature sensor.

33. The method as claimed in claim 28, wherein a clock signal having a variable clock frequency is fed to the temperature sensor by a clock generator.

34. The method as claimed in claim 28, wherein a voltage dependent on respectively measured temperature is evaluated with the aid of the temperature measuring element.

35. The method as claimed in claim 34, wherein the voltage obtained by the temperature measurement at the temperature measuring element is compared with at least one reference voltage.

36. The method as claimed in claim 34, wherein each voltage obtained during temperature measurement is compared with a reference voltage.

37. The method as claimed in claim 35, wherein each voltage which is obtained by temperature measurement and arises at the temperature measuring element is compared with precisely one reference voltage of a plurality of more than two reference voltages, wherein a voltage newly obtained by the temperature measurement is in each case alternately compared with a larger reference voltage and a smaller reference voltage of two reference voltages, wherein the larger and the smaller reference voltage have the smallest voltage difference with respect to a previously measured value of the voltage.

38. The method as claimed in claim 35, wherein each reference voltage is provided by a dedicated output terminal of a reference voltage generator.

39. The method as claimed in claim 38, wherein only those two output terminals of the reference voltage generator whose reference voltages have the smallest voltage difference with respect to the voltage obtained on account of the temperature measurement at the temperature measuring element are in each case activated, and the remaining output terminals of the reference voltage generator remain deactivated.

40. The method as claimed in claim 28, wherein measurement results of one or more temperature measurements carried out last are buffer-stored in a buffer.

41. The method as claimed in claim 40, wherein a signal is calculated from the buffer-stored measurement results of some preceding temperature measurements, which signal influences a clock frequency of a clock signal fed to the temperature sensor.

42. The method as claimed in claim 40, wherein data specifying whether a respective reference voltage was overshot or undershot by the voltage obtained on account of the temperature measurement at the temperature measuring element are in each case buffer-stored as measurement results.

43. The method as claimed in claim 41, wherein, in order to influence the clock frequency of the clock signal for the temperature sensor, the data values of a plurality of temperature measurements carried out last are added or added in weighted fashion by a summer.

44. The method as claimed in claim 42, wherein the data values are conducted cyclically successively through a plurality of register stages of a shift register, which are connected one downstream of another.

45. The method as claimed in claim 28, wherein a refresh rate of volatile memory cells of the semiconductor memory is varied with the aid of the temperature measured with a variable measuring frequency.

46. The method as claimed in claim 45, wherein the refresh rate is increased as the temperature rises and is reduced as the temperature falls.

47. The method as claimed in claim 28, wherein a parameter is varied in a temperature-dependent manner with the aid of the temperature measured with a variable measuring frequency.

* * * * *